US010965300B1

(12) United States Patent
Weng et al.

(10) Patent No.: US 10,965,300 B1
(45) Date of Patent: Mar. 30, 2021

(54) HIGH BANDWIDTH UNDER-SAMPLED SUCCESSIVE APPROXIMATION REGISTER ANALOG TO DIGITAL CONVERTER WITH NONLINEARITY MINIMIZATION

(71) Applicant: Ciena Corporation, Hanover, MD (US)

(72) Inventors: Junxian Weng, Ottawa (CA); Christopher Kurowski, Nepean (CA); Sadok Aouini, Gatineau (CA); Naim Ben-Hamida, Nepean (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/900,267

(22) Filed: Jun. 12, 2020

(51) Int. Cl.
*H03M 1/06* (2006.01)

(52) U.S. Cl.
CPC ................. *H03M 1/0612* (2013.01)

(58) Field of Classification Search
CPC .......... H03M 1/0612; H03M 1/1125; H03M 1/1095; H03M 1/466; H03M 1/468; H03M 1/462
USPC ................................................ 341/140–165
See application file for complete search history.

(56) References Cited

U.S. PATENT DOCUMENTS

| | | | | |
|---|---|---|---|---|
| 4,641,246 A * | 2/1987 | Halbert | ............... | G01R 31/2834 324/121 R |
| 4,807,147 A * | 2/1989 | Halbert | ............... | G01R 31/2834 324/76.15 |
| 5,184,062 A * | 2/1993 | Ladwig | ................... | G01R 13/32 324/121 R |
| 5,583,536 A * | 12/1996 | Cahill, III | .............. | G09G 5/395 345/641 |
| 9,985,640 B1 * | 5/2018 | Wen | ...................... | H03M 1/1038 |
| 2008/0042632 A1 * | 2/2008 | Chapuis | .............. | H02M 3/1588 323/283 |
| 2009/0128382 A1 * | 5/2009 | Matsukawa | ........ | G01R 31/3167 341/120 |
| 2011/0241912 A1 * | 10/2011 | Doris | ................... | H03M 1/0614 341/110 |
| 2013/0141263 A1 * | 6/2013 | Debnath | ............. | H03M 1/1038 341/120 |
| 2013/0194115 A1 * | 8/2013 | Wu | ........................ | H03M 1/144 341/110 |
| 2014/0266377 A1 * | 9/2014 | Atout | ..................... | H03K 3/011 327/295 |

(Continued)

*Primary Examiner* — Lam T Mai
(74) *Attorney, Agent, or Firm* — Young Basile Hanlon & MacFarlane, P.C.

(57) ABSTRACT

Described herein are apparatus and methods for a high bandwidth under-sampled successive approximation register (SAR) analog to digital converter (ADC) (SAR ADC) with non-linearity minimization. A method includes sampling, by a sampling switch triggered by a sampling clock in the SAR ADC, an input signal, determining, by a comparator in the SAR ADC, a value for a bit based on comparing the sampled input signal to a reference signal provided by a reference digital-to-analog (DAC) in the SAR ADC, wherein the input signal and the reference signal propagate through substantially similar input paths, resampling, by the sampling switch, the input signal for each successive bit, determining, by the comparator, a value for each successive bit based on comparing the resampled input signal and a reference signal for each successive bit, and outputting, by a digital controller, a digital result after determining a value for a last bit by the comparator.

20 Claims, 12 Drawing Sheets

(56) References Cited

U.S. PATENT DOCUMENTS

| | | | |
|---|---|---|---|
| 2015/0280728 A1* | 10/2015 | Singh | H03M 1/069 341/122 |
| 2016/0056830 A1* | 2/2016 | Malik | H03M 1/125 341/158 |
| 2016/0182075 A1* | 6/2016 | Devarajan | H03M 1/128 341/120 |

* cited by examiner

HIGH BANDWIDTH UNDER-SAMPLED SUCCESSIVE APPROXIMATION REGISTER ANALOG TO DIGITAL CONVERTER WITH NONLINEARITY MINIMIZATION

TECHNICAL FIELD

This disclosure relates to analog to digital converter circuits. More specifically, this disclosure relates to an under-sampled successive approximation register analog to digital converter circuits which have high bandwidth and mitigate nonlinearity issues.

BACKGROUND

Under-sampled successive approximation register (SAR) analog to digital converters (ADC) (SAR ADCs) employ binary search techniques for analog to digital conversions. In general, under-sampled SAR ADCs use a track and hold circuit (consisting of a sampling switch and a hold capacitor) to provide a sample of a repetitive waveform to a comparator, where the other input of the comparator is connected to a digital-to-analog converter (DAC) for setting a reference voltage level. By changing the reference voltage level, the voltage at the hold capacitor can be determined, theoretically, within the accuracy of the reference DAC, based on observing a transition at the comparator output.

Under-sampled SAR ADCs can be used in on-chip automated testing circuitry, as standalone test boards or devices, in oscilloscopes, or in other circuits and devices. The output data from the SAR ADCs can be used by controllers, for example, to configure or control operation of a device or circuit under test, for example. The SAR ADC is attractive because it achieves medium to high resolution (8-16 bits) with ultra-low power consumption, low circuit complexity, and highly digital implementations.

Despite these advantages, non-linearity and distortions like the pedestal effect are difficult to address, especially in high-speed operations. Overcoming these issues requires sophistical design techniques and architecture. In most cases, a compensation circuit is necessary to target a specific type of distortion. The complexity of the compensation (or cancellation) circuit will grow as number of the non-linear effects increases. In addition, a careful calibration scheme is also necessary in many cases to achieve a high-linearity performance. This adds more complexity to the overall design. For instance, many precision ADC's with high target effective number of bits (ENOB) usually dedicate a large portion of the chip design for this purpose.

SUMMARY

Described herein are apparatus and methods for a high bandwidth under-sampled successive approximation register (SAR) analog to digital converter (ADC) (SAR ADC) with nonlinearity minimization.

In implementations, a circuit includes an input signal path configured to sample an input signal, wherein sampling is triggered by a sampling clock received from a digital controller and the input signal is a repetitive waveform, a reference signal path configured to receive a reference signal from a reference digital-to analog converter (DAC), wherein the input signal path and the reference signal path are substantially matched in signal impacting properties, a comparator configured to determine a value for a bit based on comparing the sampled input signal and the reference signal, the input signal path configured to resample the input signal for each successive bit, the resampling triggered by the sampling clock, the reference signal path configured to receive a reference signal for each successive bit, the comparator configured to determine a value for each successive bit based on comparing the resampled input signal and the reference signal for each successive bit, and the digital controller configured to output a digital result after determination of a value for a last bit.

In implementations, a method includes sampling, by a sampling switch triggered by a sampling clock in an under-sampled successive approximation register (SAR) analog to digital converter (ADC) (SAR ADC), an input signal, determining, by a comparator in the under-sampled SAR ADC, a value for a bit based on comparing the sampled input signal to a reference signal provided by a reference digital-to-analog (DAC) in the under-sampled SAR ADC, wherein the input signal and the reference signal propagate through substantially similar input paths, resampling, by the sampling switch, the input signal for each successive bit, determining, by the comparator, a value for each successive bit based on comparing the resampled input signal and a reference signal for each successive bit, and outputting, by a digital controller in the under-sampled SAR ADC, a digital result after determining a value for a last bit by the comparator.

In implementations, a device includes a first under-sampled successive approximation register (SAR) analog to digital converter (ADC) (SAR ADC) including a first data path and a first reference path matched for minimizing circuit disturbances, the first under-sampled SAR ADC configured to sample a first input signal of a different input pair using a first sampling clock, perform a step in a regression process to determine a bit value based on the sampled first input signal and a reference signal, resample the first input signal for a successive step using the first sampling clock, perform the successive step to determine another bit value based on the resampled first input signal and another reference signal, and output a digital result when the regression process is complete, a second under-sampled SAR ADC including a second data path and a second reference path matched for minimizing circuit disturbances, the second under-sampled SAR ADC configured to sample a second input signal of a different input pair using a second sampling clock, perform a step in a regression process to determine a bit value based on the sampled second input signal and a reference signal for the second under-sampled SAR ADC, resample the second input signal for a successive step for the second under-sampled SAR ADC using the second sampling clock, perform the successive step for the second under-sampled SAR ADC to determine another bit value based on the resampled second input signal and another reference signal for the second under-sampled SAR ADC, and output a second digital result when the regression process is complete, and a controller configured to generate a differential output based on the digital result and the second digital result.

BRIEF DESCRIPTION OF THE DRAWINGS

The disclosure is best understood from the following detailed description when read in conjunction with the accompanying drawings. It is emphasized that, according to common practice, the various features of the drawings are not to scale. On the contrary, the dimensions of the various features are arbitrarily expanded or reduced for clarity.

DETAILED DESCRIPTION

Figure 1:
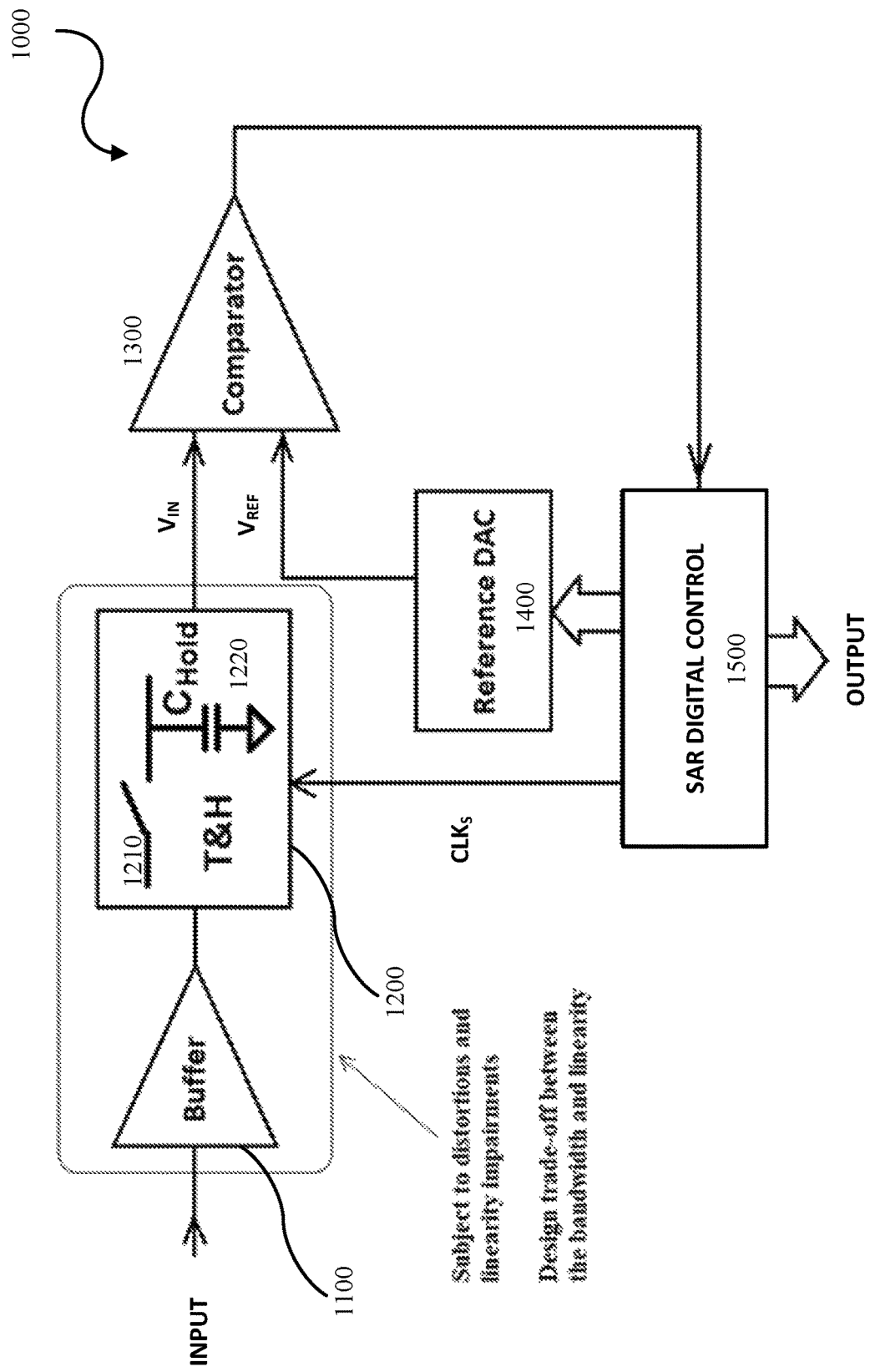
FIG. 1 is a block diagram of an example of an under-sampled successive approximation register (SAR) analog to digital converter (ADC) (SAR ADC).

Reference will now be made in greater detail to embodiments of the invention, examples of which are illustrated in the accompanying drawings. Wherever possible, the same reference numerals will be used throughout the drawings and the description to refer to the same or like parts.

As used herein, the terminology "computer" or "computing device" includes any unit, or combination of units, capable of performing any method, or any portion or portions thereof, disclosed herein. The computer or computing device may include a processor.

As used herein, the terminology "processor" indicates one or more processors, such as one or more special purpose processors, one or more digital signal processors, one or more microprocessors, one or more controllers, one or more microcontrollers, one or more application processors, one or more central processing units (CPU)s, one or more graphics processing units (GPU)s, one or more digital signal processors (DSP)s, one or more application specific integrated circuits (ASIC)s, one or more application specific standard products, one or more field programmable gate arrays, any other type or combination of integrated circuits, one or more state machines, or any combination thereof.

As used herein, the terminology "memory" indicates any computer-usable or computer-readable medium or device that can tangibly contain, store, communicate, or transport any signal or information that may be used by or in connection with any processor. For example, a memory may be one or more read-only memories (ROM), one or more random access memories (RAM), one or more registers, low power double data rate (LPDDR) memories, one or more cache memories, one or more semiconductor memory devices, one or more magnetic media, one or more optical media, one or more magneto-optical media, or any combination thereof.

As used herein, the terminology "instructions" may include directions or expressions for performing any method, or any portion or portions thereof, disclosed herein, and may be realized in hardware, software, or any combination thereof. For example, instructions may be implemented as information, such as a computer program, stored in memory that may be executed by a processor to perform any of the respective methods, algorithms, aspects, or combinations thereof, as described herein. Instructions, or a portion thereof, may be implemented as a special purpose processor, or circuitry, that may include specialized hardware for carrying out any of the methods, algorithms, aspects, or combinations thereof, as described herein. In some implementations, portions of the instructions may be distributed across multiple processors on a single device, on multiple devices, which may communicate directly or across a network such as a local area network, a wide area network, the Internet, or a combination thereof.

As used herein, the term "application" refers generally to a unit of executable software that implements or performs one or more functions, tasks or activities. The unit of executable software generally runs in a predetermined environment and/or a processor.

As used herein, the terminology "determine" and "identify," or any variations thereof includes selecting, ascertaining, computing, looking up, receiving, determining, establishing, obtaining, or otherwise identifying or determining in any manner whatsoever using one or more of the devices and methods are shown and described herein.

As used herein, the terminology "example," "the embodiment," "implementation," "aspect," "feature," or "element" indicates serving as an example, instance, or illustration. Unless expressly indicated, any example, embodiment, implementation, aspect, feature, or element is independent of each other example, embodiment, implementation, aspect, feature, or element and may be used in combination with any other example, embodiment, implementation, aspect, feature, or element.

As used herein, the terminology "or" is intended to mean an inclusive "or" rather than an exclusive "or." That is unless specified otherwise, or clear from context, "X includes A or B" is intended to indicate any of the natural inclusive permutations. That is if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from the context to be directed to a singular form.

Further, for simplicity of explanation, although the figures and descriptions herein may include sequences or series of steps or stages, elements of the methods disclosed herein may occur in various orders or concurrently. Additionally, elements of the methods disclosed herein may occur with other elements not explicitly presented and described herein. Furthermore, not all elements of the methods described herein may be required to implement a method in accordance with this disclosure. Although aspects, features, and elements are described herein in particular combinations, each aspect, feature, or element may be used independently or in various combinations with or without other aspects, features, and elements.

Further, the figures and descriptions provided herein may be simplified to illustrate aspects of the described embodiments that are relevant for a clear understanding of the herein disclosed processes, machines, manufactures, and/or compositions of matter, while eliminating for the purpose of clarity other aspects that may be found in typical similar devices, systems, compositions and methods. Those of ordinary skill may thus recognize that other elements and/or steps may be desirable or necessary to implement the devices, systems, compositions and methods described herein. However, because such elements and steps are well known in the art, and because they do not facilitate a better understanding of the disclosed embodiments, a discussion of such elements and steps may not be provided herein. However, the present disclosure is deemed to inherently include all such elements, variations, and modifications to the described aspects that would be known to those of ordinary skill in the pertinent art in light of the discussion herein.

FIG. 1 is a block diagram of an example of an under-sampled successive approximation register (SAR) analog to digital converter (ADC) (SAR ADC) 1000. The SAR ADC 1000 includes a buffer or track and hold buffer 1100 having an input connected to or in communication with (collectively "connected to") an input signal (INPUT) and an output connected to a track and hold circuit 1200, where the input signal is a repetitive waveform. The track and hold circuit 1200 includes a sampling switch 1210 connected to a hold capacitor ($C_{HOLD}$) 1220. The buffer 1100 and the track and hold circuit 1200 may be collectively referred to as a sampling circuit 500. The sampling switch 1210 has an input connected to the output of the buffer 1100 and an output connected to one end of the hold capacitor 1220, which in turn is connected to an input of a comparator 1300 to provide the sampled input signal ($V_{IN}$). The hold capacitor 1220 has a remaining end connected to ground. The comparator 1300 has another input connected to a reference voltage ($V_{REF}$) supplied by a reference digital-to-analog (DAC) 1400, which is controlled by a SAR digital controller 1500. The comparator 1300 has an output connected to an input of the SAR digital controller 1500. The SAR digital controller 1500 provides a sampling clock ($CLK_S$) to the track and hold circuit 1200 and provides an output signal (OUTPUT) to an external circuit such as a controller, digital processor, or the like to set configure or control operation of a device or circuit under test, for example.

Figure 2:
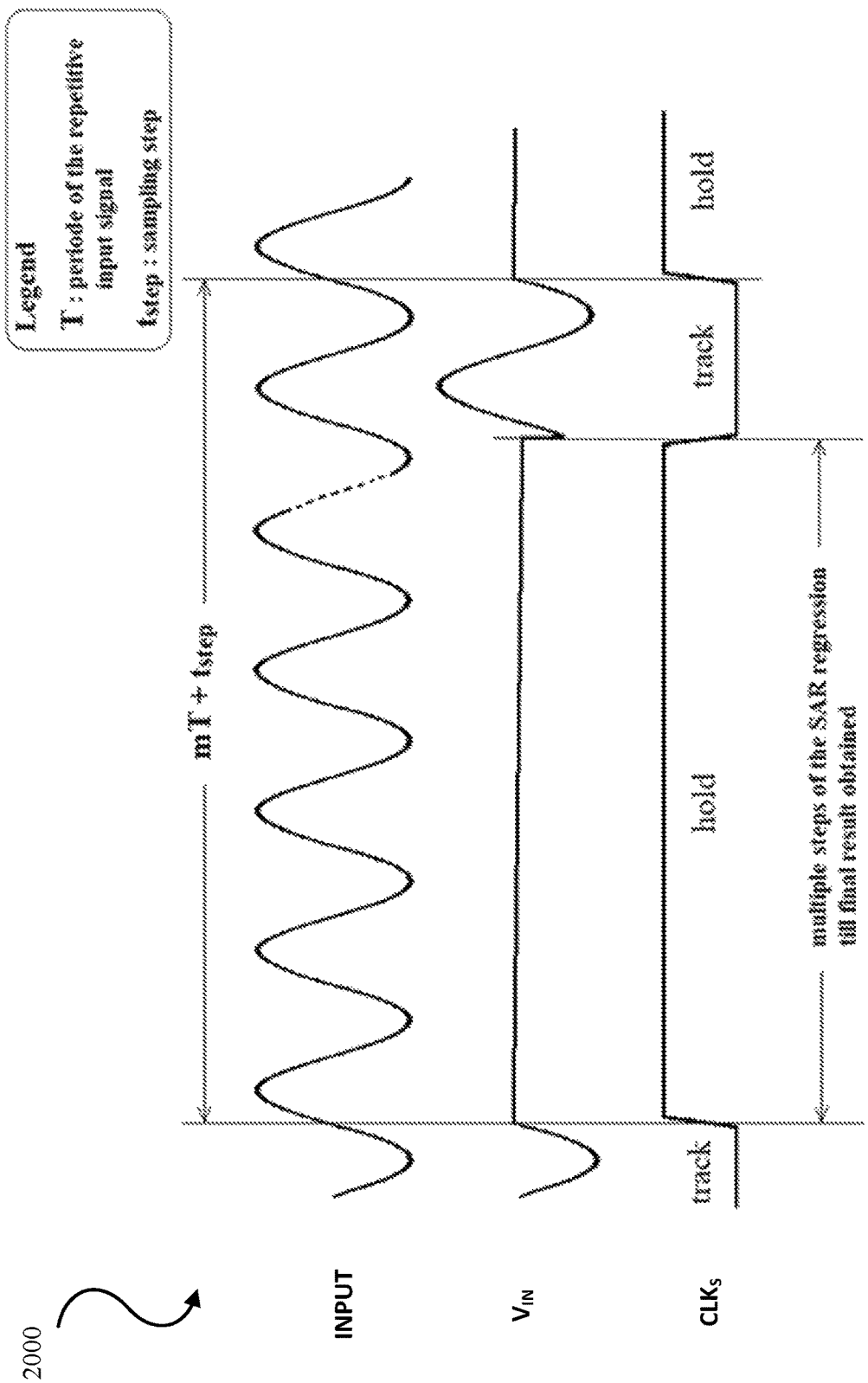
FIG. 2 is a timing diagram for the SAR ADC of FIG. 1.

The track and hold circuit 1200 samples the repetitive waveform based on the sampling clock and provides the samples to the comparator 1300. The voltage at the hold capacitor 1220 can be determined by changing the reference DAC voltage and observing a transition at the comparator 1300 output. The SAR ADC 1000 generates a digital output bit-by-bit or in multiple steps, from the most significant bit (MSB) to the least significant bit (LSB). FIG. 2 illustrates a timing diagram 2000 for the SAR ADC 1000. As shown, the input signal (INPUT) is sampled on the rising edge of the sample clock ($CLK_S$). The hold capacitor 1220 needs to hold the sampled input ($V_{IN}$) for the duration of the SAR ADC 1000 regression time, which is the time needed to resolve or convert each of the bits in a multi-bit SAR ADC 1000. The total time between each sample is $mT+t_{step}$ where T is the periodicity of the repetitive input signal, $t_{step}$ is the sampling step, and m is the number of cycles needed for the regression time.

As show, $V_{IN}$ steadily declines or drifts during the hold period, regression time, or between input signal samples. Obviously, this impacts the accuracy and performance of the SAR ADC 1000. Leakage in the hold capacitor and the comparator input may be of great concern in advanced technology nodes like FinFET. Typically, the bandwidth of a SAR ADC is determined by the size of the hold capacitor, which is serviced by the track and hold buffer and the sampling switch. For high speed, the smallest possible hold capacitor is desired; however, a small capacitor will be subject to leakage. For example, the hold capacitor cannot be too small as it must hold the voltage value throughout the SAR conversion for each sampled point, i.e., the regression time. The higher the required resolution, the longer the regression time, which in turn decreases the bandwidth of the SAR ADC.

In addition to bandwidth issues, the SAR DAC 1000 suffers from strong nonlinearity, especially when high bandwidth is required. Nonlinearity may be caused by the pedestal effect, the linearity of the input isolation buffer (e.g., buffer 1100), the common mode influenced offset of the comparator (e.g., comparator 1300), and the speed of the sampling clock relative to the signal clock. Nonlinearity is exacerbated when a small hold capacitor is utilized, a fast hold clock is used, and a fast isolation buffer is employed. A further source of nonlinearity can occur if a single comparator is used in the sampling of a differential circuit due to crossover distortion introduced by the offset in both the reference DAC (e.g., reference DAC 1400) and the comparator.

Depending on the nature of the distortion, a compensation circuit can be very complicated and difficult to design or implement for a given technology node. A complete removal of the distortions associated with clock noise and parasitic effects like power and ground couplings, leakages, etc., may not be achievable through pure circuit design techniques. Complex designs to remove the non-linear distortions while keeping the bandwidth high are expensive in terms of design effort, die area, and power consumption.

Described herein are apparatus, devices, circuits, systems, and methods for an under-sampled SAR ADC with high bandwidth and nonlinearity minimization. In implementations, the under-sampled SAR ADC samples the input signal at each step of the under-sampled SAR ADC regression. The hold capacitor can be small since the hold capacitor is being recharged prior to each bit determination or decision. In implementations, the capacitor can be in the range of femtofarads. In implementation, the capacitor can be in the range of <50 fF. This also increases the bandwidth capabilities of the under-sampled SAR ADC. In implementations, the input signal is a single-ended signal. In implementations, the input signal is a pair of differential signals. In the instance of differential input signals, an under-sampled SAR ADC circuit can be employed for each input signal of the differential input signals. The resulting output from each input signal of the differential input signals can be processed via a digital circuit to generate a differential output signal.

In implementations, the under-sampled SAR ADC can employ a double clocking structure, a sampling clock and a latching clock. The sampling clock and the latching clock are separated by a controllable phase offset. The controllable phase offset can be optimized for bit conversion. The controllable phase offset can minimize drift effects after obtaining a sample of the input signal. Consequently, accuracy is improved.

In implementations, the under-sampled SAR ADC can employ an identical or nearly identical sampling circuit for the reference DAC path as used in the input signal or data path, where the sampling circuit includes the input buffer and the track and hold circuit. The reference signal and the input signal therefore undergo the same processing upon input to the comparator. Consequently, nonlinearity effects are the same for the reference signal and the input signal. This eliminates the need for complex cancellation circuitry and techniques.

In implementations, the under-sampled SAR ADC can use an asymmetrical driver to reduce overall capacitance and further improve bandwidth capability of the under-sampled SAR ADC. The asymmetrical driver enables generation of a sharp clock edge for the sampling clock when transitioning from a track mode to a hold mode. In implementations, the rising or falling clock edge transition can occur in picoseconds.

In implementations, non-linear distortion cancellation results from the subtraction of two signals, an input signal and a reference DAC signal, which have common distortion contents. If both signals go through the same type of circuitry and have been distorted similarly, any non-linear effects and distortion is removed by the signal subtraction at a comparator. For signal level detection, the condition of interest is whether the values or voltages of the sampled input is equal to the sampled reference.

In implementations, hold capacitors can have a small size, resulting high speed operation, as matched signal paths are employed for the input signal and the reference DAC signal. The matched signal paths account for or cancel non-linear distortions due to the use of non-linear circuits. Recharging the hold capacitor at each step of the under-sampled SAR ADC regression enables implementation of the high bandwidth under-sampled SAR ADC.

In implementations, the under-sampled SAR ADC can employ a two clock structure, where a sampling clock and a latching clock are separated by a controllable phase offset. This partitions the signal level detection into two steps. First, the input signal is sampled and held using the sampling clock. Second, a comparator is triggered or activated with the latching clock. This enables improved decision making control in the presence of unwanted pedestal effects and hold capacitor leakage at the comparator input.

In implementations, an asymmetrical driver can be used to improve edge characteristics of the sampling clock and latching clock. This improves the bandwidth of the under-sampled SAR ADC and the track and hold circuit due to the faster or sharper clock edge when transitioning from tracking to hold mode. In the tracking to hold mode transition, the timing constraint is more relaxed and the clock edge can be slow or remain unchanged.

In implementations, an on-chip real time instrumentation SAR ADC can be employed without significant die area increase by using the described nonlinear compensation circuits and methods.

In implementations, under-sampled SAR ADCs as described herein can be used in on-chip automated testing circuitry, as standalone test boards or devices, in oscilloscopes, or in other circuits and devices.

Figure 3:
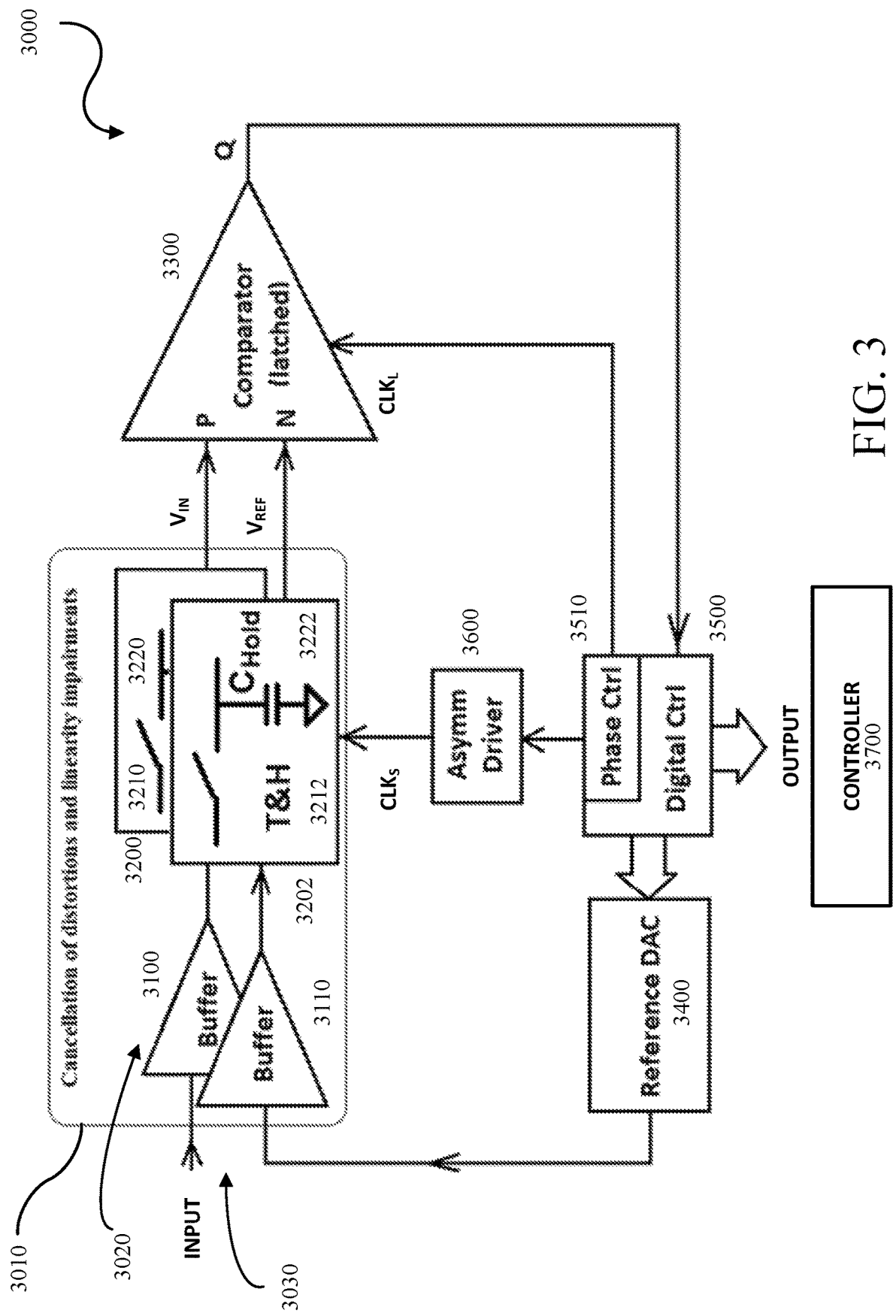
FIG. 3 is a block diagram of an example of an under-sampled SAR ADC in accordance with implementations of this disclosure.

FIG. 3 is a block diagram of an example of an under-sampled SAR ADC 3000 in accordance with implementations of this disclosure. The SAR ADC 3000 includes a sampling circuit 3010 which includes an input signal path 3020 and a reference signal path 3030. The input signal path 3020 includes a buffer or track and hold buffer 3100 having an input connected to an input signal (INPUT) and an output connected to a track and hold circuit 3200, where the input signal is a repetitive waveform. The track and hold circuit 3200 includes a sampling switch 3210 connected to a hold capacitor ($C_{HOLD}$) 3220. The sampling switch 3210 has an input connected to the output of the buffer 3100 and an output connected to one end of the hold capacitor 3220, which in turn is connected to an input of a comparator 3300 to provide a sampled input signal ($V_{IN}$). The hold capacitor 3220 has a remaining end connected to ground. The reference signal path 3030 includes a buffer or track and hold buffer 3110 having an input connected to a reference signal and an output connected to a track and hold circuit 3202, where the reference signal is provided by a reference DAC 3400, which is controlled by a SAR digital controller 3500. The track and hold circuit 3202 includes a sampling switch 3212 connected to a hold capacitor ($C_{HOLD}$) 3222. The sampling switch 3212 has an input connected to the output of the buffer 3110 and an output connected to one end of the hold capacitor 3222, which in turn is connected to a remaining input of the comparator 3300 to provide a sampled reference signal ($V_{REF}$). The hold capacitor 3222 has a remaining end connected to ground. The comparator 3300 provides an output (Q) to an input of the SAR digital controller 3500.

The SAR digital controller 3500 provides a sampling clock ($CLK_S$) to the track and hold circuit 3200 and the track and hold circuit 3202. In implementations, an asymmetric driver 3600 processes a clock signal from the SAR digital controller 3500 to generate the sampling clock. The SAR digital controller 3500 also provides the sampling clock to a phase control circuit or device 3510 which generates and provides a latching clock ($CLK_L$) to the comparator 3300. The sampling clock and the latching clock are separated by a controllable phase offset. In implementations, the SAR digital controller 3500 also provides the clock signal clock to the phase control circuit or device 3510 which generates and provides a latching clock ($CLK_L$) to the comparator 3300. The sampling clock and the latching clock are separated by a controllable phase offset. At the end of the SAR ADC regression period or the completion of the SAR ADC conversion, the SAR digital controller 3500 provides an output signal (OUTPUT) to a circuit or device such as a controller 3700, digital processor, or the like to set configure or control operation of a device or circuit under test or display test results, for example.

The track and hold circuit 3200 samples the input signal based on the sampling clock and provides the sample ($V_{IN}$) to the comparator 3300. The track and hold circuit 3202 samples the repetitive signal based on the sampling clock and provides the sample ($V_{REF}$) to the comparator 3300. A bit conversion, decision, or determination is done at the comparator 3300 based on the latching clock. The SAR ADC 3000 generates the output signal bit-by-bit or in multiple steps, from the most significant bit (MSB) to the least significant bit (LSB). After each bit conversion or step in the SAR ADC regression, the track and hold circuit 3200 samples the input signal. This recharges the hold capacitor 3220.

Figure 4:
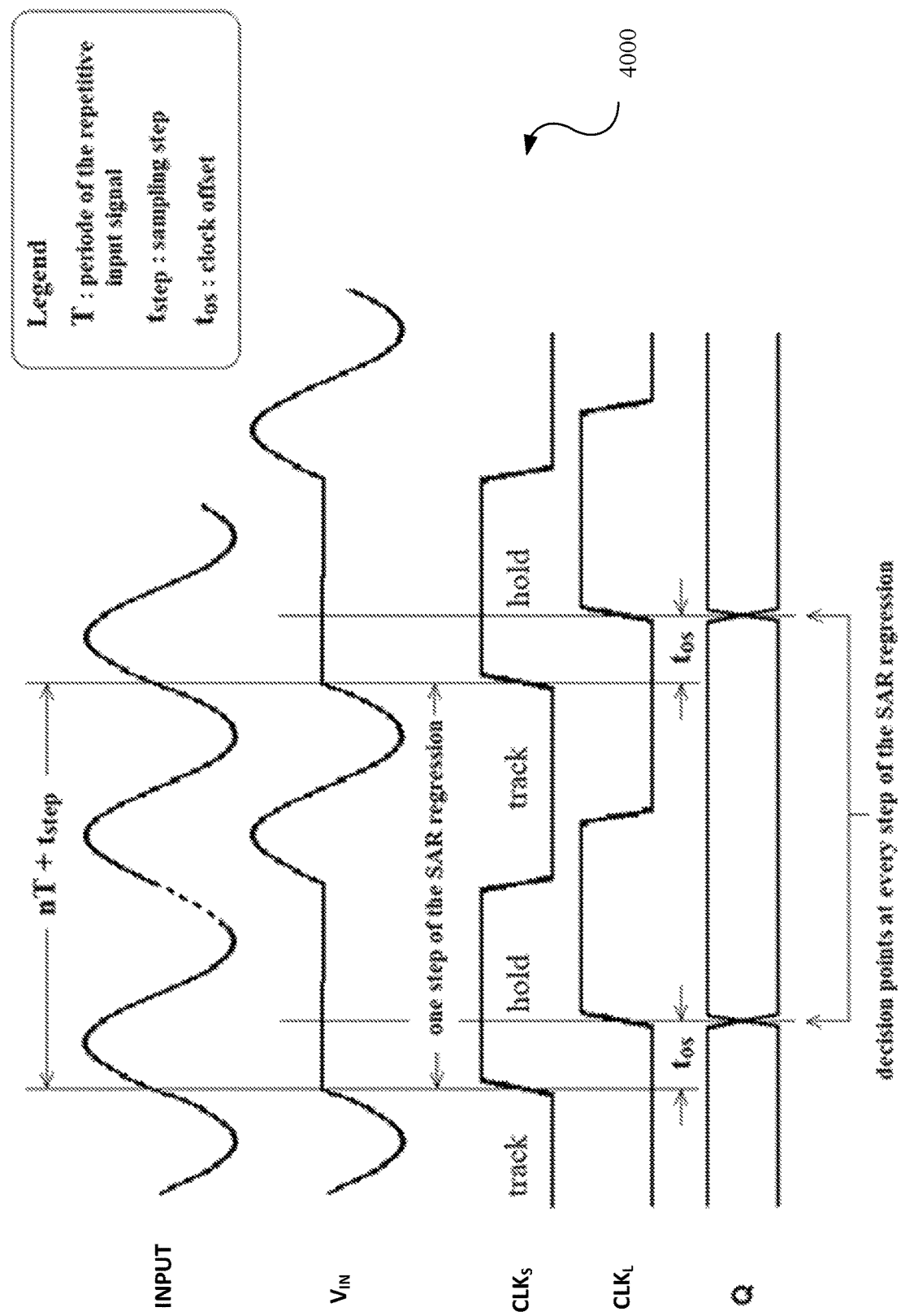
FIG. 4 is a timing diagram for the SAR ADC of FIG. 3 in accordance with implementations of this disclosure.
Figure 6:
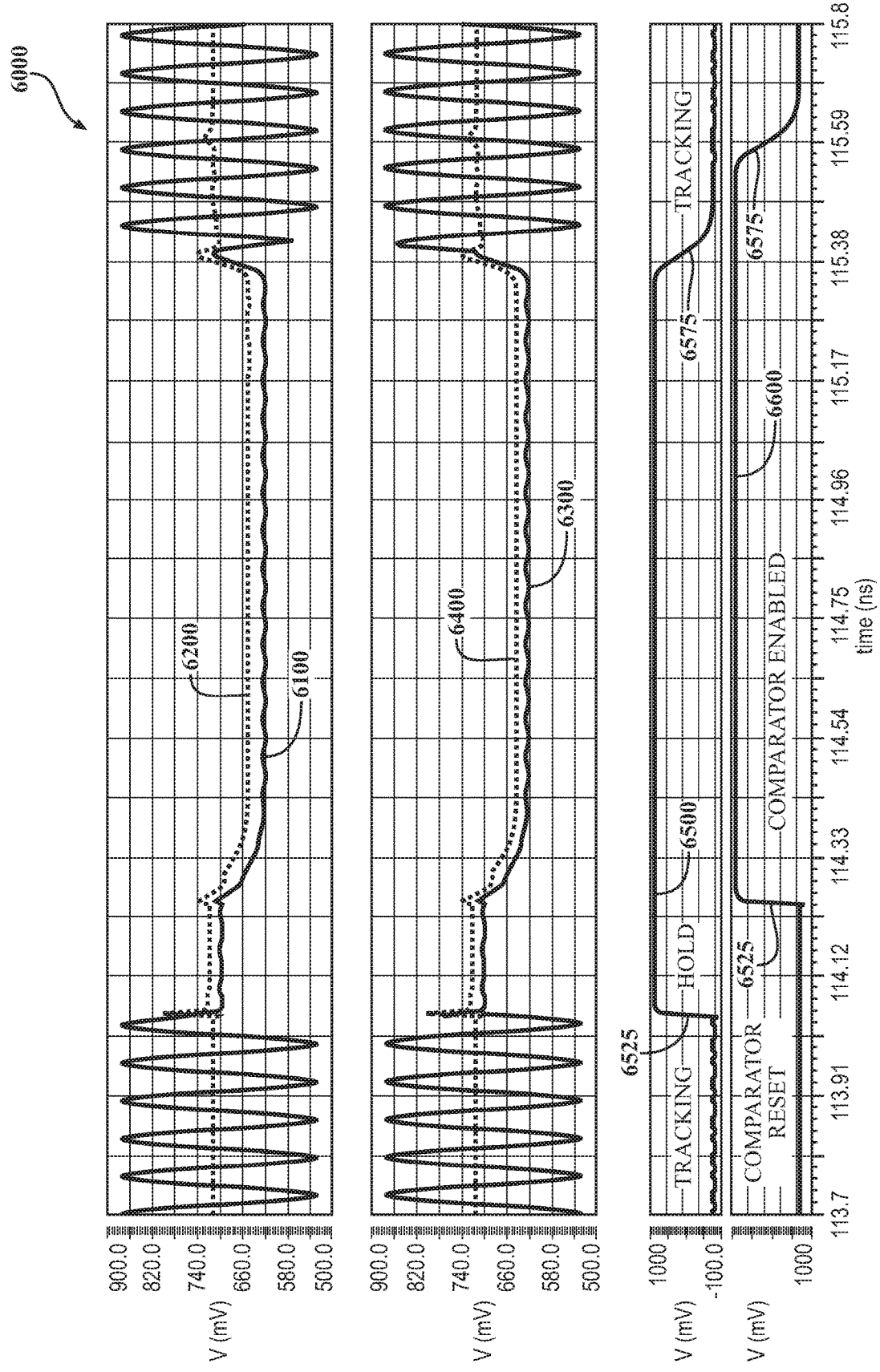
FIG. 6 is a graph of transient waveforms at an input of a comparator in accordance with embodiments of this disclosure.

The SAR ADC 3000 takes advantage of the repetitive nature of the input signal which allows for tight phase control and recharging of the hold capacitor 3220 at every step of the SAR ADC regression or conversion phase. In contrast, the SAR ADC of FIG. 1 samples the input signal once at the beginning of the conversion phase. This is shown in FIG. 4, which illustrates a timing diagram 4000 for the SAR ADC 3000. As shown, the track and hold circuit 3210 samples the input signal (INPUT) on the rising edge of the sampling clock ($CLK_S$) to generate the sampled input ($V_{IN}$). In implementations, the falling edge can be used. The comparator 3300 decides, converts or determines a bit (Q) at a rising edge of the latching clock ($CLK_L$). In implementations, the falling edge can be used. As shown, the sampling clock and the latching clock are phase offset ($t_{OS}$). The hold capacitor 3220 can hold the sampled input for a time needed to resolve, decide, convert, or determine one bit in a multi-bit SAR ADC 3000 in contrast to holding the sampled input for the regression time shown in FIGS. 1 and 2. The total time between each sample is $nT+t_{step}$ where T is the periodicity of the repetitive input signal, $t_{step}$ is the sampling step, and n is the number of cycles needed for one bit, where the integer n is much smaller than m in FIG. 2. In implementations, n is significantly smaller than m. For example, if a SAR ADC is a ten bit SAR ADC, then n is 10 times smaller than m. The sampling clock and the latching clock provide a dual clock structure which overcomes the hold capacitor 3220 leakage. The sampling clock executes the actual transition from tracking to hold and the latching clock triggers the comparator before the hold capacitor 3220 can suffer significant leakage and cause sampled input drift. In implementations, the value of the phase offset between the sampling clock and latching clock is dependent on the implementing technology. Once the level detection (driven by the edge of the latching) is done and the comparator 3300 is in latched mode, any loading effects at the input of the comparator 3300 have no impact on the output of the comparator 3300 as the hold capacitor 3220 is recharged in the next tracking-and-hold cycle. This is illustrated in FIG. 6, which shows sampled input and sample reference waveforms for a SAR ADC having a pair of differential inputs.

Nonlinearity issues are mitigated as the separated clocks allow for triggering the comparator 3300 after dynamic pedestal effects have settled. Moreover, the hold capacitor 3220 can be made small because the holding period is for a small time period as compared to a regression time for all of the bits. Consequently, a high bandwidth SAR ADC can be achieved.

As described herein, the asymmetric driver 3600 can be used to sharpen the edge of the sampling clock when transitioning from the tracking mode to the hold mode but not when making transitions from the hold mode to the tracking mode. The asymmetric driver 3600 can improve bandwidth without having to use inductively tuned buffers. This minimizes the overall buffer size of the track and hold buffer 3100 and the hold capacitor 3220.

Nonlinearity issues are also mitigated while preserving speed by using the reference signal path 3030 for the reference signal. As described herein, the reference signal path 3030 includes the buffer or track and hold buffer 3100 and the track and hold circuit 3200 which includes the sampling switch 3210 and the hold capacitor 3220. Accordingly, the reference signal is buffered, sampled and held similarly to the input signal in the input signal path 3020. The two paths, the input signal path 3020 and the reference signal path 3030 are matched and suffer from the same or substantially the same impairments. That is, the impairments or nonlinearity issues are cancelled out. As the SAR ADC regression, conversion, or convergence proceeds, the sampled reference signal approaches the same voltage as the sampled input. For first order distortions due to the effects of input buffer nonlinearity, leakage, pedestal feedthrough in the hold capacitor(s), and any loading impact from the comparator are therefore cancelled out if both the input signal path 3020 and the reference signal path 3030 are well matched. Consequently, the design trade-off between bandwidth and linearity can favor bandwidth over linearity of the buffer amplifier as non-linear effects can be cancelled out by having the input signal path 3020 and the reference signal path 3030 parametrically matched.

Thermal noise is reduced by resampling at each step or every phase sampling point. The noise floor is suppressed by approximately 3 dB per repetitive capture or resample. In implementations, the SAR ADC resampling loop can be configured to a first order circuit to shape the phase noise.

Figure 5:
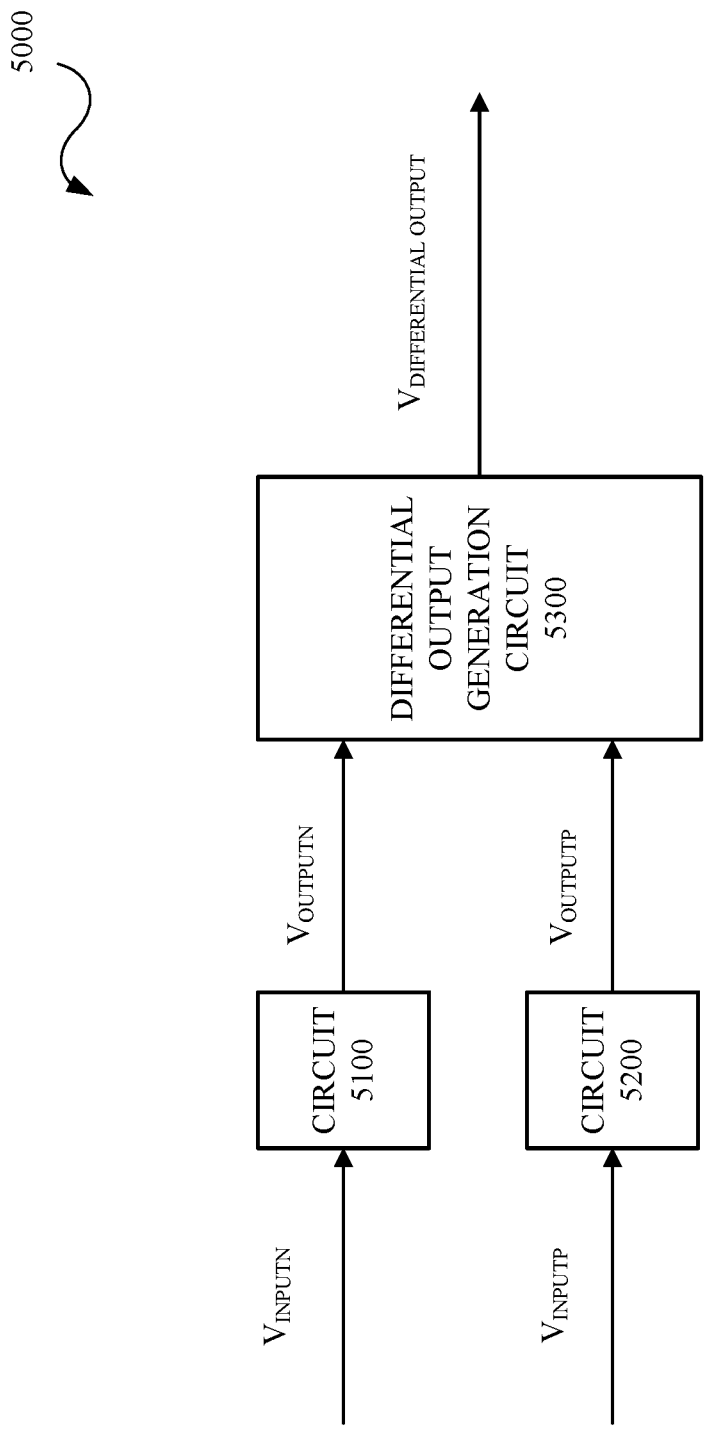
FIG. 5 is a block diagram of an example of an under-sampled SAR ADC in accordance with implementations of this disclosure.

In implementations for differential input signals, crossover distortion can be addressed by providing a SAR ADC 3000 for the P side of the differential input and a SAR ADC 3000 for the N side of the differential input such that crossover distortion becomes a DC offset. The full differential result calculation is then done in the digital domain. This is illustrated in FIG. 5, which shows a block diagram of an example of an under-sampled SAR ADC 5000 in accordance with implementations of this disclosure.

The SAR ADC 5000 can include a circuit 5100 and a circuit 5200, both of which are connected to differential output generation circuit 5300. The circuit 5100 and the circuit 5200 can implement the SAR ADC 3000 of FIG. 3, a SAR ADC 9000 of FIG. 9, a SAR ADC 10000 of FIG. 10, a SAR ADC 11000 of FIG. 11, or combinations thereof, as appropriate and applicable. The circuit 5100 has an input connected to an input signal N of a differential input pair ($V_{INPUTN}$) and an output connected to the differential output generation circuit 5300. The circuit 5200 has an input connected to an input signal P of the differential input pair ($V_{INPUTP}$) and an output connected to the differential output generation circuit 5300. The differential output generation circuit 5300 digitally processes the outputs of the circuit 5100 and the circuit 5200 to generate a differential output ($V_{DIFFERENTIAL\ OUTPUT}$).

In implementations, the SAR ADC 5000 can capacitively couple a portion of the buffered input signal P to a hold capacitor for the input signal N and capacitively couple a portion of the buffered input signal N to a hold capacitor for the input signal P. This can cancel or mitigate the signal or switch feedthrough from respective sampling switches in respective track and hold circuits in the SAR ADC 5000.

FIG. 6 is a graph 6000 of simulated transient waveforms at an input of a comparator in accordance with embodiments of this disclosure. The graph 6000 shows a sampled input signal N 6100 of a differential input pair, a sampled reference signal 6200, a sampled input signal P 6300 of the differential input pair, a sampled reference signal 6400, a sampling clock 6500, and a latching clock 6600. The values of the sampled input signal N 6100, the sampled reference signal 6200, the sampled input signal P 6300 and the sampled reference signal 6400 have settled before a rising edge 6625 of the latching clock 6600.

Figure 7:
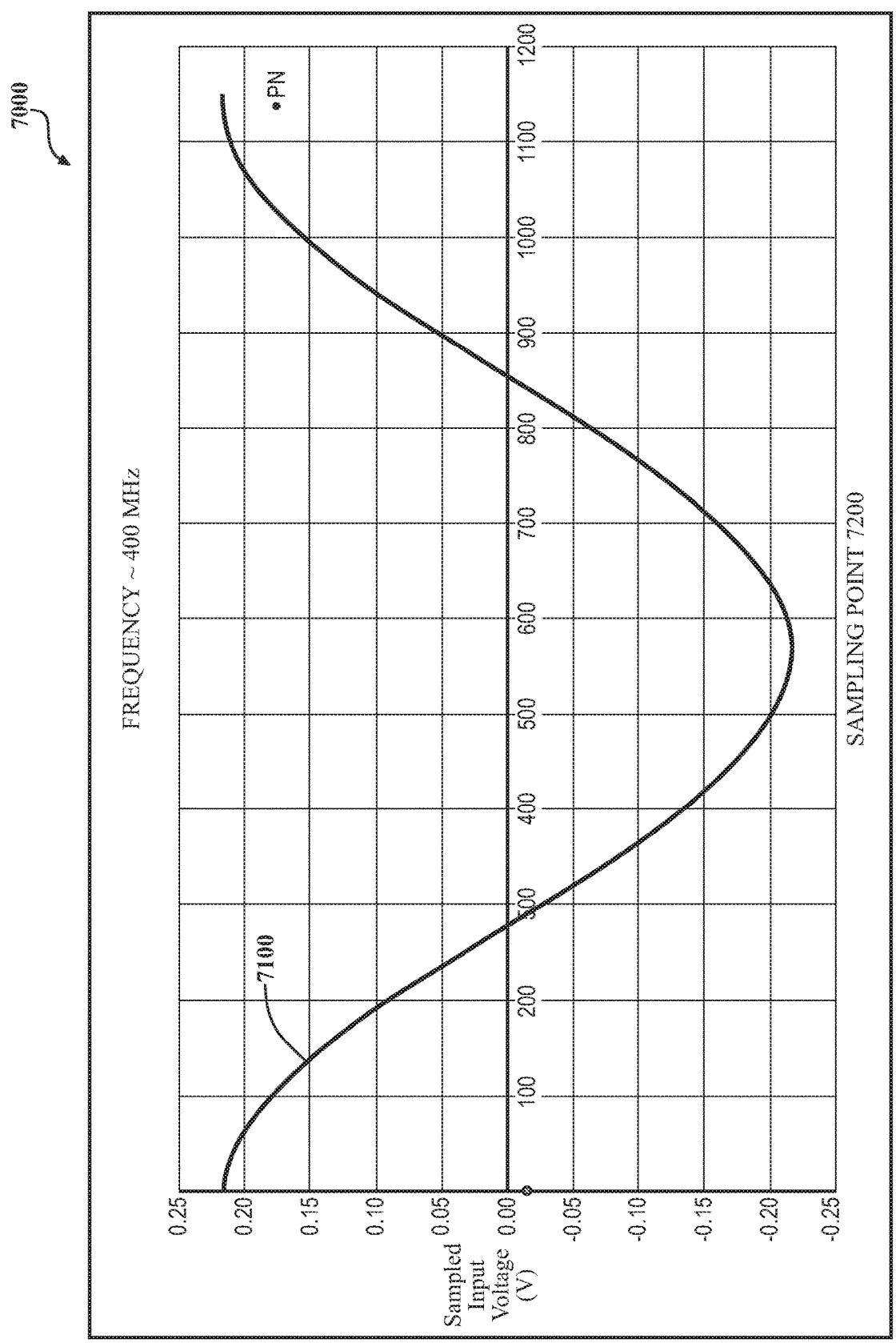
FIG. 7 is a graph of a sampled sinusoidal input in accordance with embodiments of this disclosure.
Figure 8:
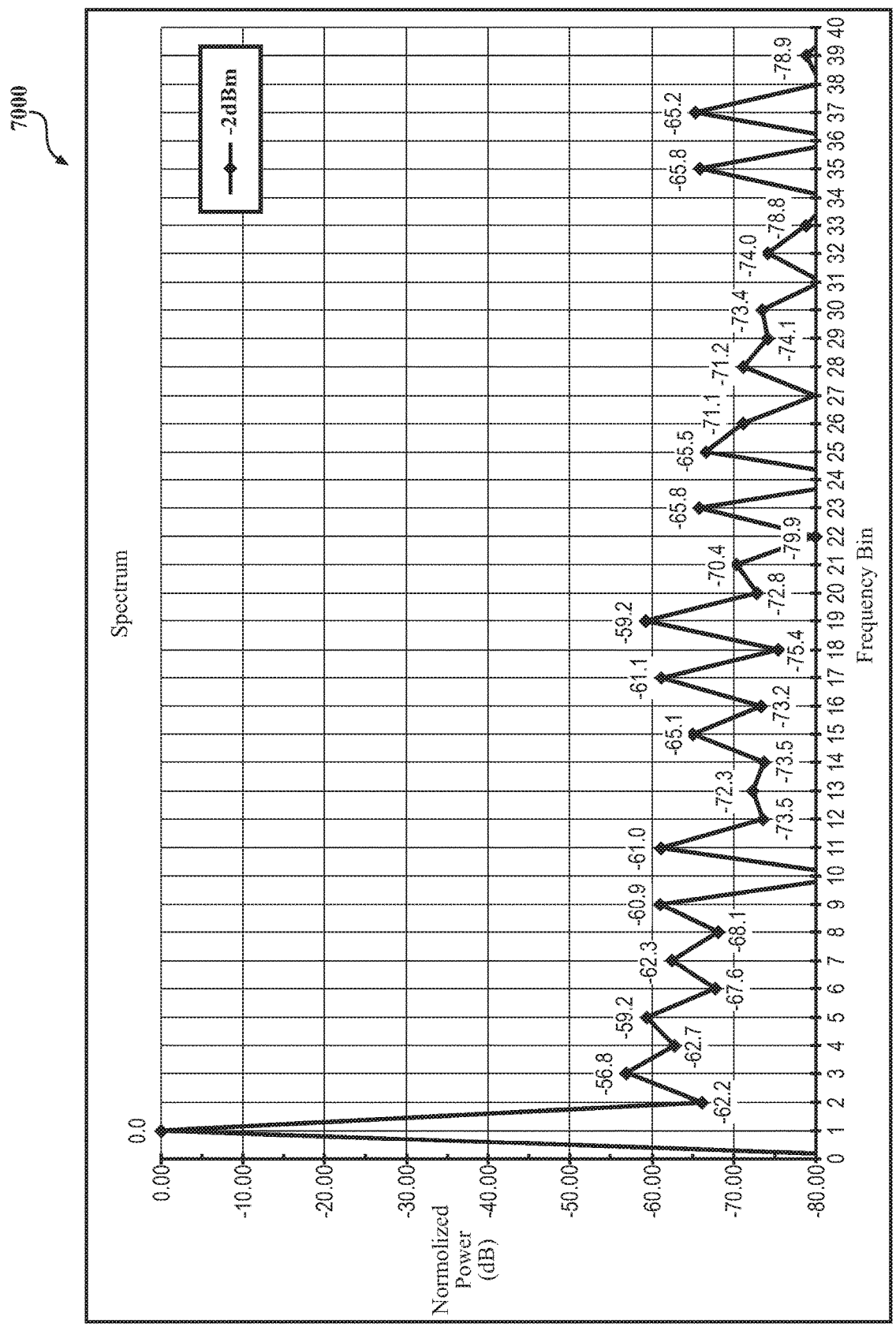
FIG. 8 is a graph of a fast Fourier transform at a sampling point of the sampled sinusoidal input in accordance with embodiments of this disclosure.

FIG. 7 is a graph 7000 of a sampled sinusoidal input 7100 in accordance with embodiments of this disclosure. A sampling point 7200 of the sampled sinusoidal input 7100 is shown. FIG. 8 is a graph 8000 of a fast Fourier transform at the sampling point 7200 of the sampled sinusoidal input 7100 in accordance with embodiments of this disclosure.

Figure 9:
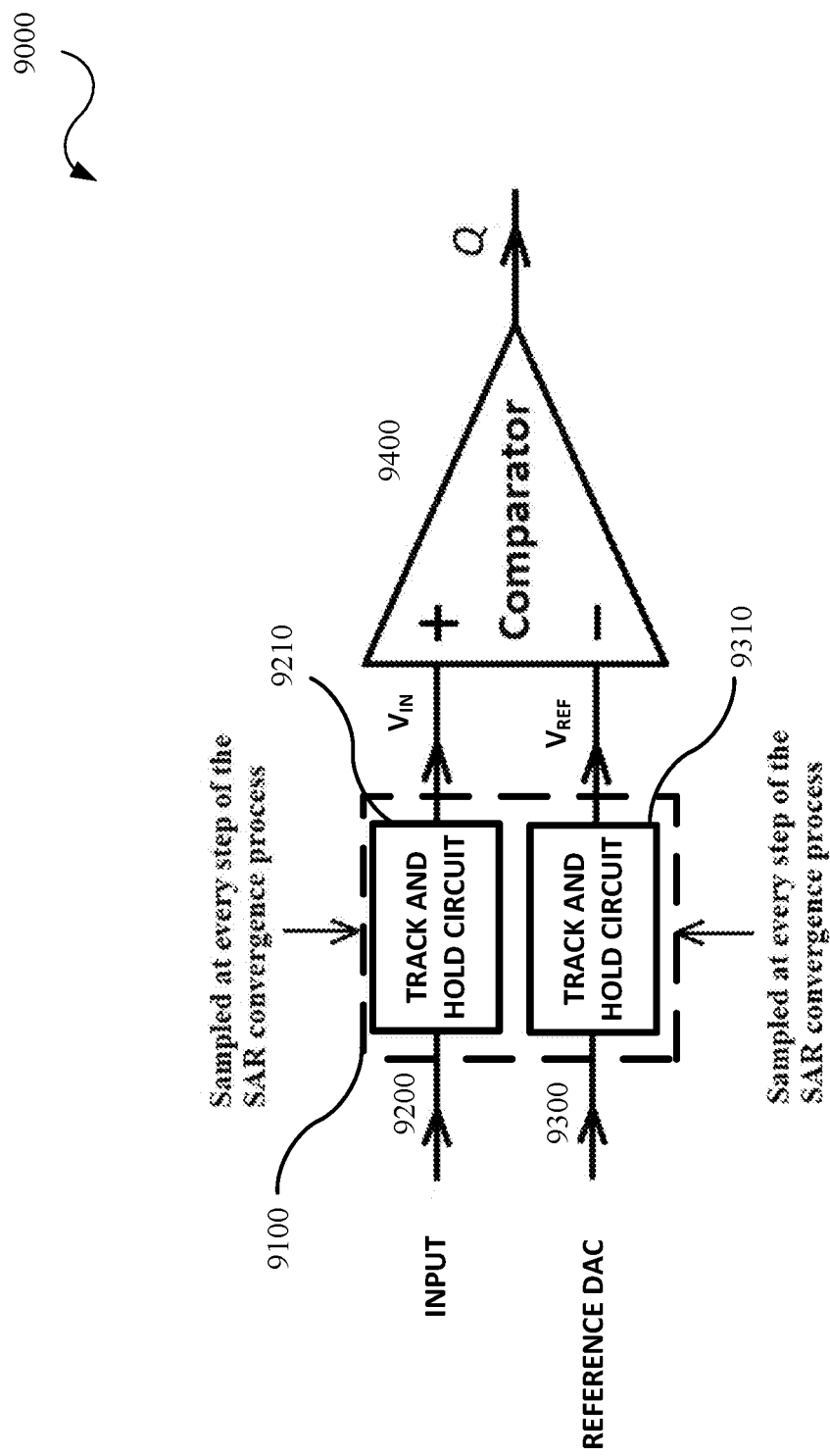
FIG. 9 is a partial block diagram of an example of an under-sampled SAR ADC in accordance with implementations of this disclosure.

FIG. 9 is a partial block diagram of an example of an under-sampled SAR ADC 9000 in accordance with implementations of this disclosure. The SAR ADC 9000 can implement the features or elements of the SAR ADC 3000 of FIG. 3, the SAR ADC 5000 of FIG. 5, the SAR ADC 10000 of FIG. 10, the SAR ADC 11000 of FIG. 11, or combinations thereof, as appropriate and applicable. Certain elements are omitted for purposes of ease of illustration only.

The SAR ADC 9000 includes a sampling circuit 9100 which includes an input signal path 9200 and a reference signal path 9300. The input signal path 9200 includes a buffer or track and hold buffer (as shown in FIG. 3 for example) which is connected to an input signal (INPUT), a track and hold circuit 9210 which is connected to an input of a comparator 9400 to provide a sampled input signal ($V_{IN}$), where the input signal is a repetitive waveform. The reference signal path 9300 includes a buffer or track and hold buffer (as shown in FIG. 3 for example) which is connected to a reference DAC signal (REFERENCE DAC), a track and hold circuit 9210 which is connected to another input of the comparator 9400 to provide a sampled reference signal ($V_{REF}$).

Operationally, the SAR ADC 9000 functions and operates as described for any of the SAR ADCs described herein except as noted herein. In the SAR ADC 9000, the reference DAC signal is sampled at each step of the SAR ADC regression or conversion similar to the resampling of the input signal. Accordingly, nonlinearity issues are cancelled out, again similar to the resampled input signal.

Figure 10:
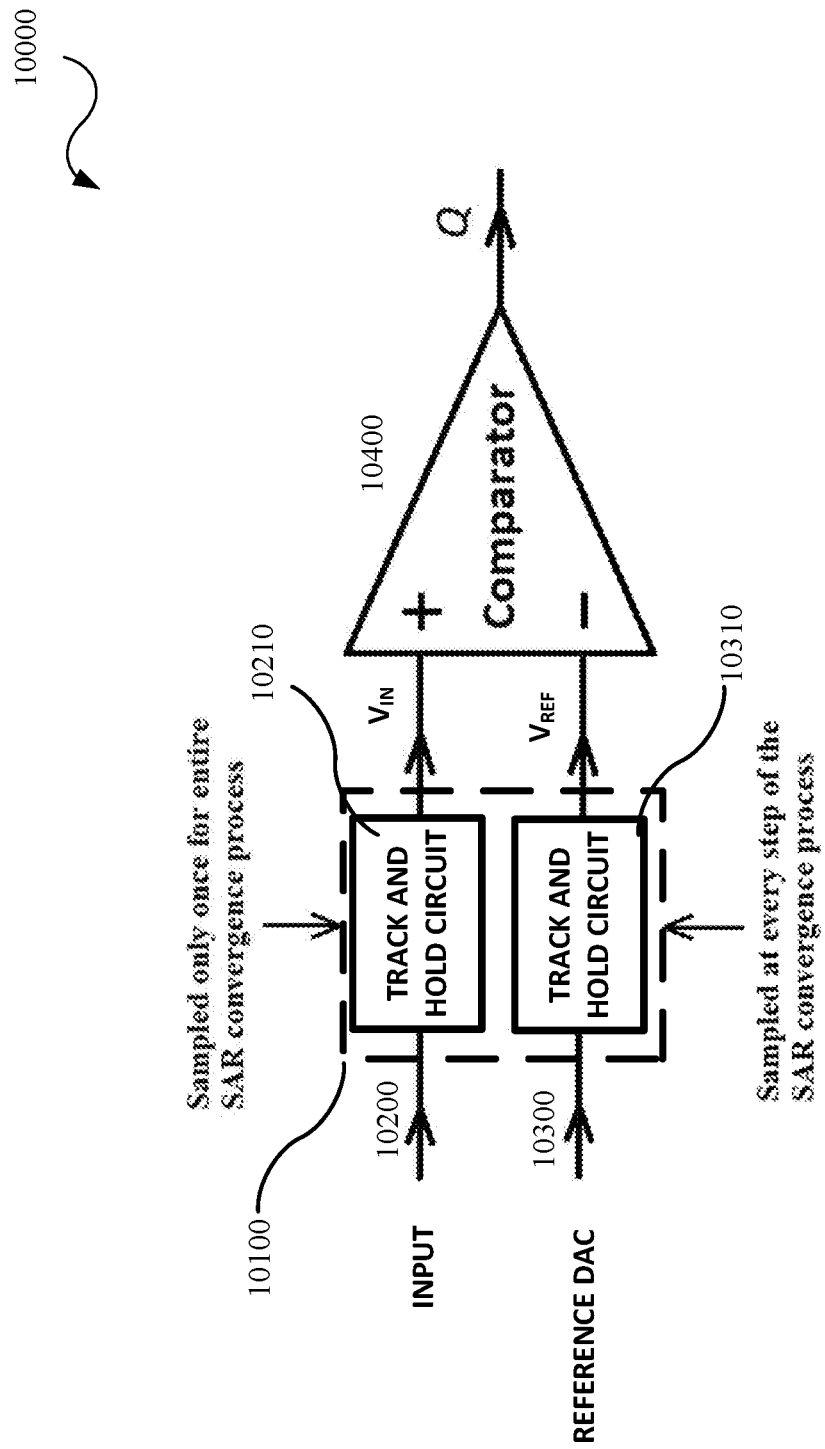
FIG. 10 is a block diagram of an example of an under-sampled SAR ADC in accordance with implementations of this disclosure.

FIG. 10 is a partial block diagram of an example of an under-sampled SAR ADC 10000 in accordance with implementations of this disclosure. The SAR ADC 10000 can implement the features or elements of SAR ADC 3000 of FIG. 3, the SAR ADC 5000 of FIG. 5, the SAR ADC 9000 of FIG. 9, the SAR ADC 11000 of FIG. 11, or combinations thereof, as appropriate and applicable. Certain elements are omitted for purposes of ease of illustration only.

The SAR ADC 10000 includes a sampling circuit 10100 which includes an input signal path 10200 and a reference signal path 10300. The input signal path 10200 includes a buffer or track and hold buffer (as shown in FIG. 3 for example) which is connected to an input signal (INPUT), a track and hold circuit 10210 which is connected to an input of a comparator 10400 to provide a sampled input signal ($V_{IN}$), where the input signal is a repetitive waveform. The reference signal path 10300 includes a buffer or track and hold buffer (as shown in FIG. 3 for example) which is connected to a reference DAC signal (REFERENCE DAC), a track and hold circuit 10310 which is connected to another input of the comparator 10400 to provide a sampled reference signal ($V_{REF}$).

Operationally, the SAR ADC 10000 functions and operates as described for any of the SAR ADCs described herein except as noted herein. Certain nonlinearity issues are not present when a SAR ADC has lower bandwidth and linearization is obtainable. For example, when the SAR ADC is an interleaved SAR ADC. In these instances, the SAR ADC, such as the SAR ADC 10000, samples the input signal once during the regression time or convergence process. The reference DAC signal is sampled at each step during the regression or convergence. As the SAR ADC 10000 converges a voltage of the sampled reference towards the sampled input, the pedestal effects are matched for both the input and the reference signals.

Figure 11:
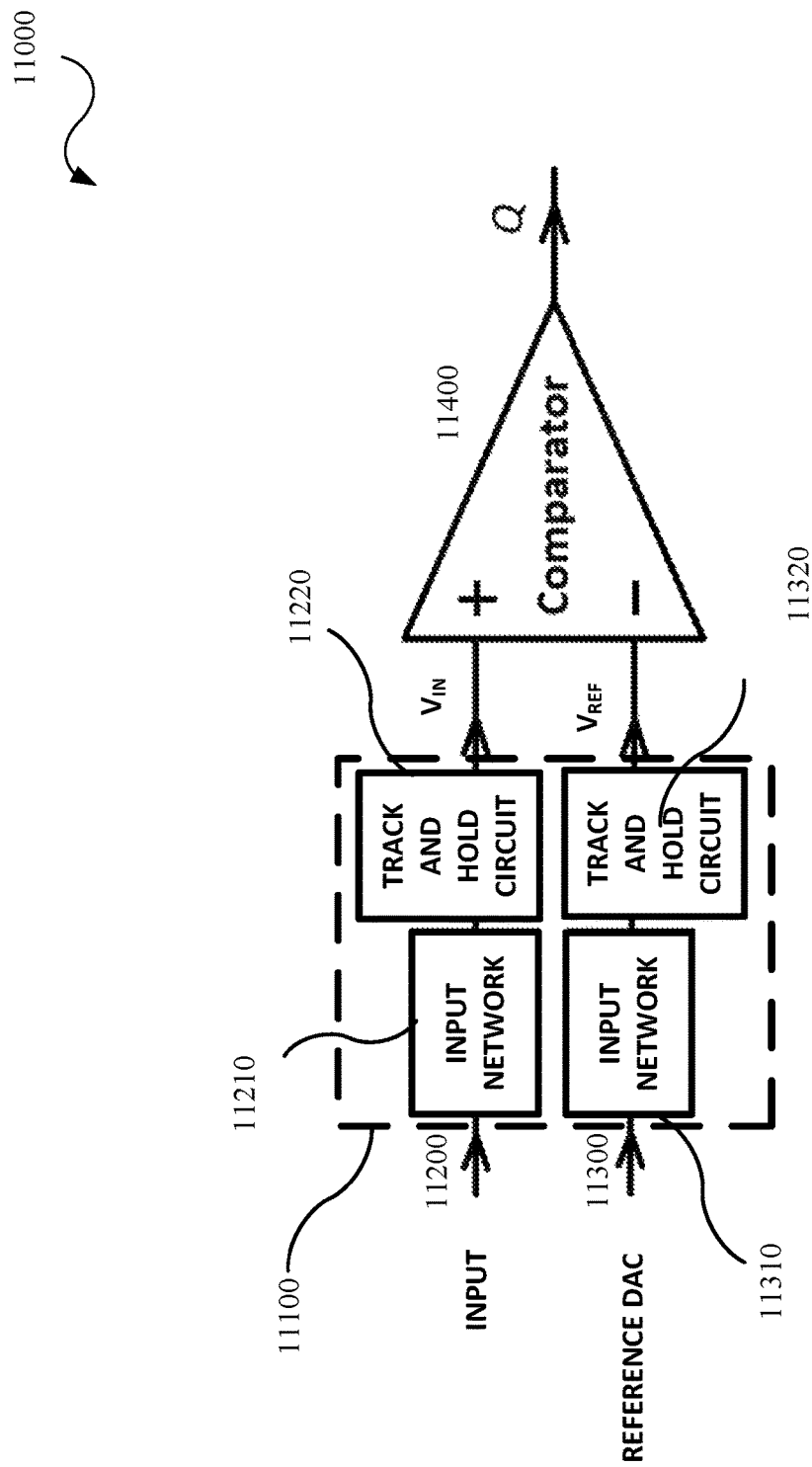
FIG. 11 is a block diagram of an example of an under-sampled SAR ADC in accordance with implementations of this disclosure.

FIG. 11 is a block diagram of an example of an under-sampled SAR ADC 11000 in accordance with implementations of this disclosure. The SAR ADC 11000 can implement the features or elements of SAR ADC 3000 of FIG. 3, the SAR ADC 5000 of FIG. 5, the SAR ADC 9000 of FIG. 9, the SAR ADC 10000 of FIG. 10, or combinations thereof, as appropriate and applicable. Certain elements are omitted for purposes of ease of illustration only.

The SAR ADC 11000 includes a sampling circuit 11100 which includes an input signal path 11200 and a reference signal path 11300. The input signal path 11200 includes an input network 11210 which is connected to an input signal (INPUT) and to a track and hold circuit 11220, which in turn is connected to an input of a comparator 11400 to provide a sampled input signal ($V_{IN}$), where the input signal is a repetitive waveform. The reference signal path 11300 includes an input network 11310 which is connected to a reference DAC signal (REFERENCE DAC) and to a track and hold circuit 11320, which in turn is connected to another input of the comparator 11400 to provide a sampled reference signal ($V_{REF}$).

Operationally, the SAR ADC 11000 functions and operates as described for any of the SAR ADCs described herein except as noted herein. The input network 11210 and the input network 11310 can shunt the input signal and the reference DAC signal, respectively, to dummy loads to squelch switch feedthrough. For SAR ADC which do not employ dual matched signal paths such as the input signal path 11200 and the reference signal path 11300, the use of the input network 11210 and the input network 1310 can exacerbate pedestal errors. Since matched signal paths are provided, the SAR ADC 11000 can use the input network 11210 and the input network 11310 to minimize or mitigate switching feedthrough.

Figure 12:
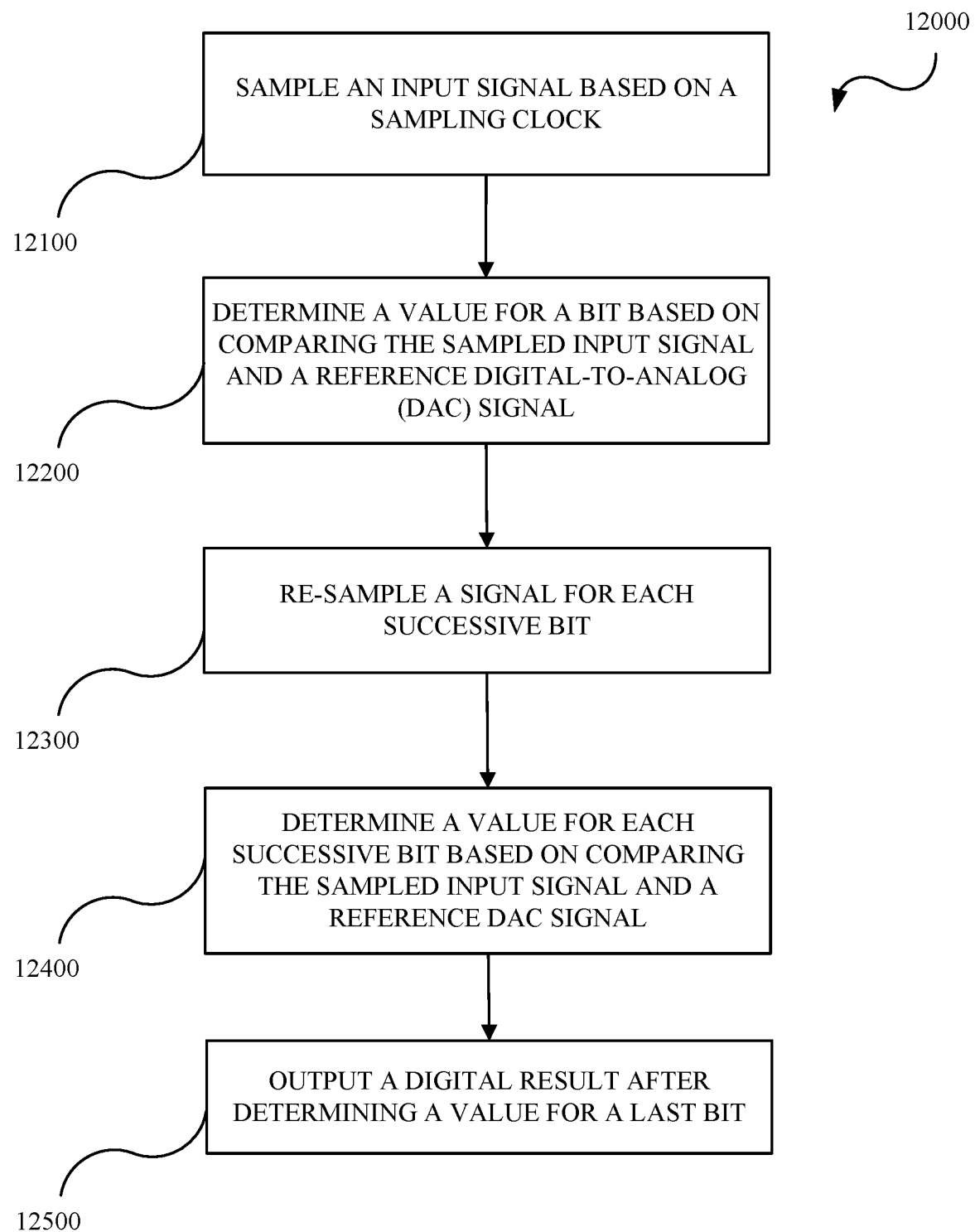
FIG. 12 is a flowchart of an example technique for an under-sampled SAR ADC in accordance with embodiments of this disclosure.

FIG. 12 is a flowchart of an example method 12000 for an under-sampled SAR ADC in accordance with embodiments of this disclosure. The method 12000 includes: sampling 12100 an input signal based on a sampling clock; determining 12200 a value for a bit based on comparing the sampled input signal and a reference digital-to-analog (DAC) signal; re-sampling 12300 a signal for each successive bit; determining 12400 a value for each successive bit based on comparing the sampled input signal and a reference DAC signal; and outputting 12500 a digital result after determining a value for a last bit. The method 12000 can be implemented by the SAR ADC 3000 of FIG. 3, the SAR ADC 5000 of FIG. 5, the SAR ADC 9000 of FIG. 9, the SAR ADC 10000 of FIG. 10, and the SAR ADC 11000 of FIG. 11, as appropriate and applicable.

The method 12000 includes sampling 12100 an input signal based on a sampling clock. An input signal is received at a sampling circuit in a m-bit under-sampled successive approximation register (SAR) analog to digital converter (ADC) (SAR ADC). The sampling circuit includes at least an input signal path. In implementations, the input signal path includes an input buffer and a track and hold circuit. In implementations, the input signal path includes an input network and a track and hold circuit. In implementations, the input signal path includes an input buffer, input network, and a track and hold circuit. The input signal is sampled on receipt of an edge of the sampling clock by a sampling switch in the track and hold circuit and the sampled input signal is held by or charges a hold capacitor. In implementations, the sampling clock is provided by a SAR ADC digital controller. In implementations, the sampling clock is provided by an asymmetric driver which enhances edge characteristics of the sampling clock. In implementations, an under-sampled SAR ADC is provided for each input signal in a differential input pair.

The method 12000 includes determining 12200 a value for a bit based on comparing the sampled input signal and a reference digital-to-analog (DAC) signal. A value is determined for each bit in the m-bit under-sampled SAR ADC by comparing the sampled input signal to a reference input signal. In implementations, the sampling circuit includes a reference signal path which matches the input signal path in terms of non-linearity, distortion, pedestal effects, thermal noise, and other like signal impacting properties. In implementations, the reference DAC signal is sampled using the sampling clock to generate a sampled reference DAC signal for input to the comparator. In implementations, the determination by the comparator is triggered by a latching clock which is controllably phase offset from the sampling clock. In implementations, the latching clock can be provided via the asymmetric driver to improve edge characteristics.

The method 12000 includes re-sampling 12300 the input signal for each successive bit. In implementations, the input signal is re-sampled for each bit upon conversion completion of the previous bit. This recharges the hold capacitor in the input signal path to mitigate capacitor leakage and drift. In implementations, the reference DAC signal is re-sampled for each bit upon conversion completion of the previous bit. This recharges the hold capacitor in the reference signal path and results in maintaining matching signal paths.

The method 12000 includes determining 12400 a value for each successive bit based on comparing the resampled input signal and a reference DAC signal. The m-bit under-sampled SAR ADC generates a value for each of the m bits.

The method 12000 includes outputting 12500 a digital result after determining a value for a last bit. The under-sampled SAR ADC generates the digital result based on the input signal for use by a controller to calibrate, adjust, and the like of other circuits or devices. In implementations, for differential input signals, each under-sampled SAR ADC outputs a digital result, which is then processed by a controller to generate a differential output. In implementations, the under-sampled SAR ADC can be automated test equipment, circuit, or device for an application specific integrated circuit (ASIC) and the like. In implementations, the under-sampled SAR ADC can be embedded automated test equipment, circuit, or device for an application specific integrated circuit (ASIC) and the like. In implementations, the under-sampled SAR ADC can be part of or integrated with an oscilloscope. In implementations, the under-sampled SAR ADC can be part of or integrated with a digital oscilloscope. In implementations, the under-sampled SAR ADC can be a standalone test board, device, or circuit.

In general, a circuit includes an input signal path configured to sample an input signal, wherein sampling is triggered by a sampling clock received from a digital controller and the input signal is a repetitive waveform, a reference signal path configured to receive a reference signal from a reference digital-to analog converter (DAC), wherein the input signal path and the reference signal path are substantially matched in signal impacting properties, a comparator configured to determine a value for a bit based on comparing the sampled input signal and the reference signal, the input signal path configured to resample the input signal for each successive bit, the resampling triggered by the sampling clock, the reference signal path configured to receive a reference signal for each successive bit, the comparator configured to determine a value for each successive bit based on comparing the resampled input signal and the reference signal for each successive bit, and the digital controller configured to output a digital result after determination of a value for a last bit. In implementations, the circuit further comprising a latching clock configured to trigger the comparator to make a determination, wherein the latching clock is phase offset from the sampling clock. In implementations, the circuit further comprising a phase controller configured to set the phase offset, wherein the phase offset is set and a hold capacitor for the input signal path is sized to maximize speed and bandwidth. In implementations, an edge of the sampling clock triggers the sampling and the resampling, the circuit further comprising an asymmetric driver configured to sharpen edge characteristics of the edge of the sampling clock. In implementations, the reference signal and the reference signal for each successive bit are a sampled reference signal and a sampled reference signal for each successive bit, wherein sampling is triggered by the sampling clock. In implementations, the input signal is first input signal of a differential input pair, the circuit further comprising a second input signal path configured to sample a second input signal of the differential input pair, the sampling triggered by a second sampling clock received from a second digital controller, a second reference signal path configured to receive a reference signal from a second reference DAC, wherein the second input signal path and the second reference signal path are substantially matched in signal impacting properties, a second comparator configured to determine a value for a bit based on comparing the sampled second input signal and the reference signal from the second reference DAC, the second input signal path configured to resample the second input signal for each successive bit, the resampling triggered by the second sampling clock, the second reference signal path configured to receive a reference signal from the second reference DAC for each successive bit, the second comparator configured to determine a value for each successive bit based on comparing the resampled second input signal and the reference signal from the second reference DAC for each successive bit, and the second digital controller configured to output a second digital result after determination of a value for a last bit, wherein a differential output is generated from the digital result and the second digital result. In implementations, the input signal path includes at least an input network and a sampling switch, the input network configured to shunt the input signal to dummy loads to squelch sampling switch feedthrough.

In general, a method includes sampling, by a sampling switch triggered by a sampling clock in an under-sampled successive approximation register (SAR) analog to digital converter (ADC) (SAR ADC), an input signal, determining, by a comparator in the under-sampled SAR ADC, a value for a bit based on comparing the sampled input signal to a reference signal provided by a reference digital-to-analog (DAC) in the under-sampled SAR ADC, wherein the input signal and the reference signal propagate through substantially similar input paths, resampling, by the sampling switch, the input signal for each successive bit, determining, by the comparator, a value for each successive bit based on comparing the resampled input signal and a reference signal for each successive bit, and outputting, by a digital controller in the under-sampled SAR ADC, a digital result after determining a value for a last bit by the comparator. In implementations, the method further comprising activating the comparator by a latching clock, wherein the latching clock is phase offset from the sampling clock. In implementations, the method further comprising setting, by a phase controller in the under-sampled SAR ADC, the phase offset to minimize drift in the sampled input signal and the resampled input signal. In implementations, an edge of the sampling clock triggers the sampling and the resampling, the method further comprising sharpening, by an asymmetric driver in the under-sampled SAR ADC, edge characteristics of the edge of the sampling clock. In implementations, the reference signal and the reference signal for each successive bit are a sampled reference signal and a sampled reference signal for each successive bit, respectively, the method further comprising sampling, by a sampling switch in a reference input path, the reference signal, and sampling, by the sampling switch in the reference input path, the reference signal for each successive bit. In implementations, the method further comprising shunting, by an input network in the under-sampled SAR ADC, the input signal to dummy loads to squelch sampling switch feedthrough. In implementations, the input signal is first input signal of a differential input pair, the method further comprising sampling, by a sampling switch triggered by a sampling clock in another under-sampled SAR ADC, a second input signal of the differential input pair, determining, by a comparator in the another under-sampled SAR ADC, a value for a bit based on comparing the sampled second input signal to a reference signal provided by a reference digital-to-analog (DAC) in the another under-sampled SAR ADC, wherein the second input signal and the reference signal in the another under-sampled SAR ADC propagate through substantially similar input paths, re-sampling, by the sampling switch in the another under-sampled SAR ADC, the second input signal for each successive bit, determining, by the comparator in the another under-sampled SAR ADC, a value for each successive bit based on comparing the resampled second input signal and a reference signal for each successive bit in the another under-sampled SAR ADC, outputting, by a digital controller in the another under-sampled SAR ADC, a second digital result after determining a value for a last bit by the comparator in the another under-sampled SAR ADC, and generating, by a controller, a differential output from the digital result and the second digital result.

In general, a device includes a first under-sampled successive approximation register (SAR) analog to digital converter (ADC) (SAR ADC) including a first data path and a first reference path matched for minimizing circuit disturbances, the first under-sampled SAR ADC configured to sample a first input signal of a different input pair using a first sampling clock, perform a step in a regression process to determine a bit value based on the sampled first input signal and a reference signal, resample the first input signal for a successive step using the first sampling clock, perform the successive step to determine another bit value based on the resampled first input signal and another reference signal, and output a digital result when the regression process is complete, a second under-sampled SAR ADC including a second data path and a second reference path matched for minimizing circuit disturbances, the second under-sampled SAR ADC configured to sample a second input signal of a different input pair using a second sampling clock, perform a step in a regression process to determine a bit value based on the sampled second input signal and a reference signal for the second under-sampled SAR ADC, resample the second input signal for a successive step for the second under-sampled SAR ADC using the second sampling clock, perform the successive step for the second under-sampled SAR ADC to determine another bit value based on the resampled second input signal and another reference signal for the second under-sampled SAR ADC, and output a second digital result when the regression process is complete, and a controller configured to generate a differential output based on the digital result and the second digital result. In implementations, the first under-sampled SAR ADC and the second SAR ADC each include a latching clock configured to trigger a comparator to make a determination, wherein a first latching clock is phase offset from the first sampling clock and a second latching clock is phase offset from the second sampling clock. In implementations, the first under-sampled SAR ADC and the second SAR ADC each include a phase controller configured to set each phase offset, wherein the phase offset is set to minimize capacitor voltage drift. In implementations, the first under-sampled SAR ADC and the second SAR ADC each include an asymmetric driver configured to sharpen edge characteristics of an edge of the first sampling clock and an edge of the second sampling clock, respectively. In implementations, the reference signal and the another reference signal are resampled for each step and the reference signal for the second under-sampled SAR ADC and the another reference signal for the second under-sampled SAR ADC are resampled for each step. In implementations, the first under-sampled SAR ADC and the second SAR ADC each include an input network configured to shunt an input signal to dummy loads to squelch sampling switch feedthrough.

Although some embodiments herein refer to methods, it will be appreciated by one skilled in the art that they may also be embodied as a system or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "processor," "device," or "system." Furthermore, aspects of the present invention may take the form of a computer program product embodied in one or more the computer readable mediums having the computer readable program code embodied thereon. Any combination of one or more computer readable mediums may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to CDs, DVDs, wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowcharts and block diagrams in the figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures.

While the disclosure has been described in connection with certain embodiments, it is to be understood that the disclosure is not to be limited to the disclosed embodiments but, on the contrary, is intended to cover various modifications, combinations, and equivalent arrangements included within the scope of the appended claims, which scope is to be accorded the broadest interpretation so as to encompass all such modifications and equivalent structures as is permitted under the law.

What is claimed is:

1. A circuit comprising:
an input signal path configured to sample an input signal, wherein sampling is triggered by a sampling clock received from a digital controller and the input signal is a repetitive waveform;
a reference signal path configured to receive a reference signal from a reference digital-to analog converter (DAC), wherein the input signal path and the reference signal path are substantially matched in signal impacting properties;
a comparator configured to determine a value for a bit based on comparing the sampled input signal and the reference signal;
the input signal path configured to resample the input signal for each successive bit, the resampling triggered by the sampling clock;
the reference signal path configured to receive a reference signal for each successive bit;
the comparator configured to determine a value for each successive bit based on comparing the resampled input signal and the reference signal for each successive bit; and
the digital controller configured to output a digital result after determination of a value for a last bit.

2. The circuit of claim 1, further comprising a latching clock configured to trigger the comparator to make a determination, wherein the latching clock is phase offset from the sampling clock.

3. The circuit of claim 2, further comprising a phase controller configured to set the phase offset, wherein the phase offset is set and a hold capacitor for the input signal path is sized to maximize speed and bandwidth.

4. The circuit of claim 1, wherein an edge of the sampling clock triggers the sampling and the resampling, the circuit further comprising an asymmetric driver configured to sharpen edge characteristics of the edge of the sampling clock.

5. The circuit of claim 1, wherein the reference signal and the reference signal for each successive bit are a sampled reference signal and a sampled reference signal for each successive bit, wherein sampling is triggered by the sampling clock.

6. The circuit of claim 1, wherein the input signal is first input signal of a differential input pair, the circuit further comprising
a second input signal path configured to sample a second input signal of the differential input pair, the sampling triggered by a second sampling clock received from a second digital controller;
a second reference signal path configured to receive a reference signal from a second reference DAC, wherein the second input signal path and the second reference signal path are substantially matched in signal impacting properties;
a second comparator configured to determine a value for a bit based on comparing the sampled second input signal and the reference signal from the second reference DAC;
the second input signal path configured to resample the second input signal for each successive bit, the resampling triggered by the second sampling clock;
the second reference signal path configured to receive a reference signal from the second reference DAC for each successive bit;
the second comparator configured to determine a value for each successive bit based on comparing the resampled second input signal and the reference signal from the second reference DAC for each successive bit; and
the second digital controller configured to output a second digital result after determination of a value for a last bit, wherein a differential output is generated from the digital result and the second digital result.

7. The circuit of claim 1, wherein the input signal path includes at least an input network and a sampling switch, the input network configured to shunt the input signal to dummy loads to squelch sampling switch feedthrough.

8. A method comprising:
sampling, by a sampling switch triggered by a sampling clock in an under-sampled successive approximation register (SAR) analog to digital converter (ADC) (SAR ADC), an input signal;
determining, by a comparator in the under-sampled SAR ADC, a value for a bit based on comparing the sampled input signal to a reference signal provided by a reference digital-to-analog (DAC) in the under-sampled SAR ADC, wherein the input signal and the reference signal propagate through substantially similar input paths;
resampling, by the sampling switch, the input signal for each successive bit;
determining, by the comparator, a value for each successive bit based on comparing the resampled input signal and a reference signal for each successive bit; and
outputting, by a digital controller in the under-sampled SAR ADC, a digital result after determining a value for a last bit by the comparator.

9. The method of claim 8, the method further comprising activating the comparator by a latching clock, wherein the latching clock is phase offset from the sampling clock.

10. The method of claim 9, the method further comprising setting, by a phase controller in the under-sampled SAR ADC, the phase offset to minimize drift in the sampled input signal and the resampled input signal.

11. The method of claim 8, wherein an edge of the sampling clock triggers the sampling and the resampling, the method further comprising sharpening, by an asymmetric driver in the under-sampled SAR ADC, edge characteristics of the edge of the sampling clock.

12. The method of claim 8, wherein the reference signal and the reference signal for each successive bit are a sampled reference signal and a sampled reference signal for each successive bit, respectively, the method further comprising sampling, by a sampling switch in a reference input path, the reference signal, and sampling, by the sampling switch in the reference input path, the reference signal for each successive bit.

13. The method of claim 8, the method further comprising shunting, by an input network in the under-sampled SAR ADC, the input signal to dummy loads to squelch sampling switch feedthrough.

14. The method of claim 8, wherein the input signal is first input signal of a differential input pair, the method further comprising
sampling, by a sampling switch triggered by a sampling clock in another under-sampled SAR ADC, a second input signal of the differential input pair;
determining, by a comparator in the another under-sampled SAR ADC, a value for a bit based on comparing the sampled second input signal to a reference signal provided by a reference digital-to-analog (DAC) in the another under-sampled SAR ADC, wherein the second input signal and the reference signal in the another under-sampled SAR ADC propagate through substantially similar input paths;
re-sampling, by the sampling switch in the another under-sampled SAR ADC, the second input signal for each successive bit;
determining, by the comparator in the another under-sampled SAR ADC, a value for each successive bit based on comparing the resampled second input signal and a reference signal for each successive bit in the another under-sampled SAR ADC;
outputting, by a digital controller in the another under-sampled SAR ADC, a second digital result after determining a value for a last bit by the comparator in the another under-sampled SAR ADC; and
generating, by a controller, a differential output from the digital result and the second digital result.

15. A device comprising:
a first under-sampled successive approximation register (SAR) analog to digital converter (ADC) (SAR ADC) including a first data path and a first reference path matched for minimizing circuit disturbances, the first under-sampled SAR ADC configured to sample a first input signal of a different input pair using a first sampling clock, perform a step in a regression process to determine a bit value based on the sampled first input signal and a reference signal, resample the first input signal for a successive step using the first sampling clock, perform the successive step to determine another bit value based on the resampled first input signal and another reference signal, and output a digital result when the regression process is complete;
a second under-sampled SAR ADC including a second data path and a second reference path matched for minimizing circuit disturbances, the second under-sampled SAR ADC configured to sample a second input signal of a different input pair using a second sampling clock, perform a step in a regression process to determine a bit value based on the sampled second input signal and a reference signal for the second under-sampled SAR ADC, resample the second input signal for a successive step for the second under-sampled SAR ADC using the second sampling clock, perform the successive step for the second under-sampled SAR ADC to determine another bit value based on the resampled second input signal and another reference signal for the second under-sampled SAR ADC, and output a second digital result when the regression process is complete; and
a controller configured to generate a differential output based on the digital result and the second digital result.

16. The device of claim 15, wherein the first under-sampled SAR ADC and the second SAR ADC each include a latching clock configured to trigger a comparator to make a determination, wherein a first latching clock is phase offset from the first sampling clock and a second latching clock is phase offset from the second sampling clock.

17. The device of claim 16, wherein the first under-sampled SAR ADC and the second SAR ADC each include a phase controller configured to set each phase offset, wherein the phase offset is set to minimize capacitor voltage drift.

18. The device of claim 15, wherein the first under-sampled SAR ADC and the second SAR ADC each include an asymmetric driver configured to sharpen edge characteristics of an edge of the first sampling clock and an edge of the second sampling clock, respectively.

19. The device of claim 15, wherein the reference signal and the another reference signal are resampled for each step and the reference signal for the second under-sampled SAR ADC and the another reference signal for the second under-sampled SAR ADC are resampled for each step.

20. The device of claim 15, wherein the first under-sampled SAR ADC and the second SAR ADC each include an input network configured to shunt an input signal to dummy loads to squelch sampling switch feedthrough.

* * * * *